United States Patent [19]
An et al.

[11] Patent Number: 6,015,758
[45] Date of Patent: Jan. 18, 2000

[54] METHOD OF STRIPPING A WAFER OF ITS FILM WITH GAS INJECTED INTO A CVD APPARATUS IN WHICH THE WAFER IS DISPOSED

[75] Inventors: Joong-il An; Kyung-su Kim; Jung-su Lim, all of Kyungki-do; Jung-ki Kim, Seoul, all of Rep. of Korea

[73] Assignee: Samsung Electronics Co., Ltd., Suwon, Rep. of Korea

[21] Appl. No.: 09/140,332

[22] Filed: Aug. 26, 1998

[30] Foreign Application Priority Data

Oct. 10, 1997 [KR] Rep. of Korea ...................... 97-52120

[51] Int. Cl.[7] .................................................. H01L 21/00
[52] U.S. Cl. ............................. 438/706; 216/37; 216/59; 156/345; 438/719; 438/8
[58] Field of Search ..................................... 438/694, 706, 438/719, 723, 724, 743, 744, 14, 8.9; 216/37, 58, 59, 67, 79; 156/345 P, 345 V, 345 M; 134/1.2, 1.3

[56] References Cited

U.S. PATENT DOCUMENTS

| | | | |
|---|---|---|---|
| 4,786,352 | 11/1988 | Benzing | 156/345 |
| 5,304,405 | 4/1994 | Kobayashi et al. | 216/37 X |
| 5,545,289 | 8/1996 | Chen et al. | 134/1.2 X |
| 5,916,820 | 6/1999 | Okumura et al. | 216/37 X |

*Primary Examiner*—William Powell
*Attorney, Agent, or Firm*—Jones Volentine, LLP

[57] ABSTRACT

A method for stripping a film from a wafer substrate includes the steps of inserting a boat holding the wafer into a processing chamber of a CVD apparatus, and injecting gas into the chamber, to thereby strip the wafer of its film. A typical film requiring stripping is a polysilicon film grown on an underlying oxide layer of the substrate. In this case, $CIF_3$ is used to strip the polysilicon film without damaging the oxide layer. Accordingly, this method is applicable to the quality testing of semiconductor wafer films using a test wafer. In such quality testing a film is formed on a test wafer substrate at the same time the semiconductor wafer film is formed. The film of the test wafer is tested to evaluate the quality of the formation of the semiconductor wafer film. The test wafer can then be stripped within the chemical vapor deposition apparatus and thus can be reused soon thereafter.

18 Claims, 4 Drawing Sheets

METHOD OF STRIPPING A WAFER OF ITS FILM WITH GAS INJECTED INTO A CVD APPARATUS IN WHICH THE WAFER IS DISPOSED

BACKGROUND OF THE INVENTION

1. Field of the Invention

The present invention relates to a method of manufacturing semiconductor devices. More particularly, the present invention relates to a method of stripping a film from a wafer and which film had been formed on the wafer by chemical vapor deposition (CVD).

2. Description of the Related Art

When manufacturing a semiconductor device, various films such as an oxide film, a nitride film and a polysilicon film, are often formed on a wafer by chemical vapor deposition (CVD). The CVD process typically involves forming a film on both the wafer that is being processed and on a test wafer used for evaluating the quality of the film. The film formed on the test wafer is stripped therefrom after the quality test so that the test wafer can be reused.

In the conventional art, a wet etch method has been used for stripping the film formed on the test wafer. In this method (wafer stripping), the wafer is submersed in a wet bath filled with chemicals. In order to ensure that the film from the test wafer is completely stripped, the wafer is usually over-etched. Accordingly, the thickness of the wafer is reduced. As a result, the wafer becomes unusable after being stripped a number of times.

Another problem occurs when multiple layers must be formed on the test wafer. For example, in a process of producing a polysilicon film, the polysilicon is grown on an oxide film previously formed on the wafer. However, when stripping the polysilicon layer from the oxide layer, the oxide layer may be damaged or stripped. Accordingly, a new oxide film must be regrown before the test wafer can be reused. The repeated stripping and regrowing of the oxide layer is uneconomical and time consuming.

In an attempt to solve the above problems, a dry etching process using plasma to strip a wafer has been developed. However, this method can only be used to strip the wafers one by one. Thus, this method is also time consuming.

SUMMARY OF THE INVENTION

Accordingly, it is an object of the present invention to provide a wafer stripping method capable of minimizing the destruction of wafers, of simultaneously stripping a plurality of wafers, and of preventing an oxide film previously formed on the wafer from being damaged so as to be reusable.

To achieve the above object, the method of the present invention includes the steps of inserting a wafer comprising a film into a chemical vapor deposition (CVD) apparatus, and then injecting a gas into the CVD apparatus, to thereby strip the film from the substrate of the wafer.

Preferably, the film is of polysilicon, the gas is $ClF_3$ supplied at a rate of 500~1,000 sccm, and the temperature in the CVD apparatus is maintained at 350~450° C.

It is also preferable that the pressure inside the CVD apparatus be maintained constant and within the range of 1.0~2.0 Torr. To this end, an ambient gas is injected into the CVD apparatus during the stripping of the film from the wafer substrate. The ambient gas can be either $N_2$ and Ar, and is supplied at a rate of 2,500~3,000 sccm.

Furthermore, the wafer can be rotated during the process to facilitate the stripping of the film from its substrate.

Once the film is stripped, the wafer can be reused. For instance, in the case of a test wafer, a new semiconductor wafer substrate can be loaded into the CVD apparatus along with the stripped test wafer substrate, and films can be simultaneously deposited thereon. Then, the film of the test wafer can once again be tested to evaluate the quality of the film formed on the new semiconductor wafer substrate.

According to the present invention, the upper film of the test wafer can be stripped without affecting the lower film, so that there is no need to reform the lower film, and the wafer is left undamaged. Therefore, the wafer can be reused soon after being stripped, thus saving time and production costs. Also, owing to the use of a processing chamber into which gas can be injected, a plurality of wafers can be simultaneously stripped, thereby saving time when compared to the conventional dry etch method by which wafers are stripped one at a time.

BRIEF DESCRIPTION OF THE DRAWINGS

The above and other objects, features and advantages of the present invention will become more apparent from the following detailed description of a preferred embodiment thereof made with reference to the attached drawings in which.

DETAILED DESCRIPTION OF THE PREFERRED EMBODIMENT

Figure 1:
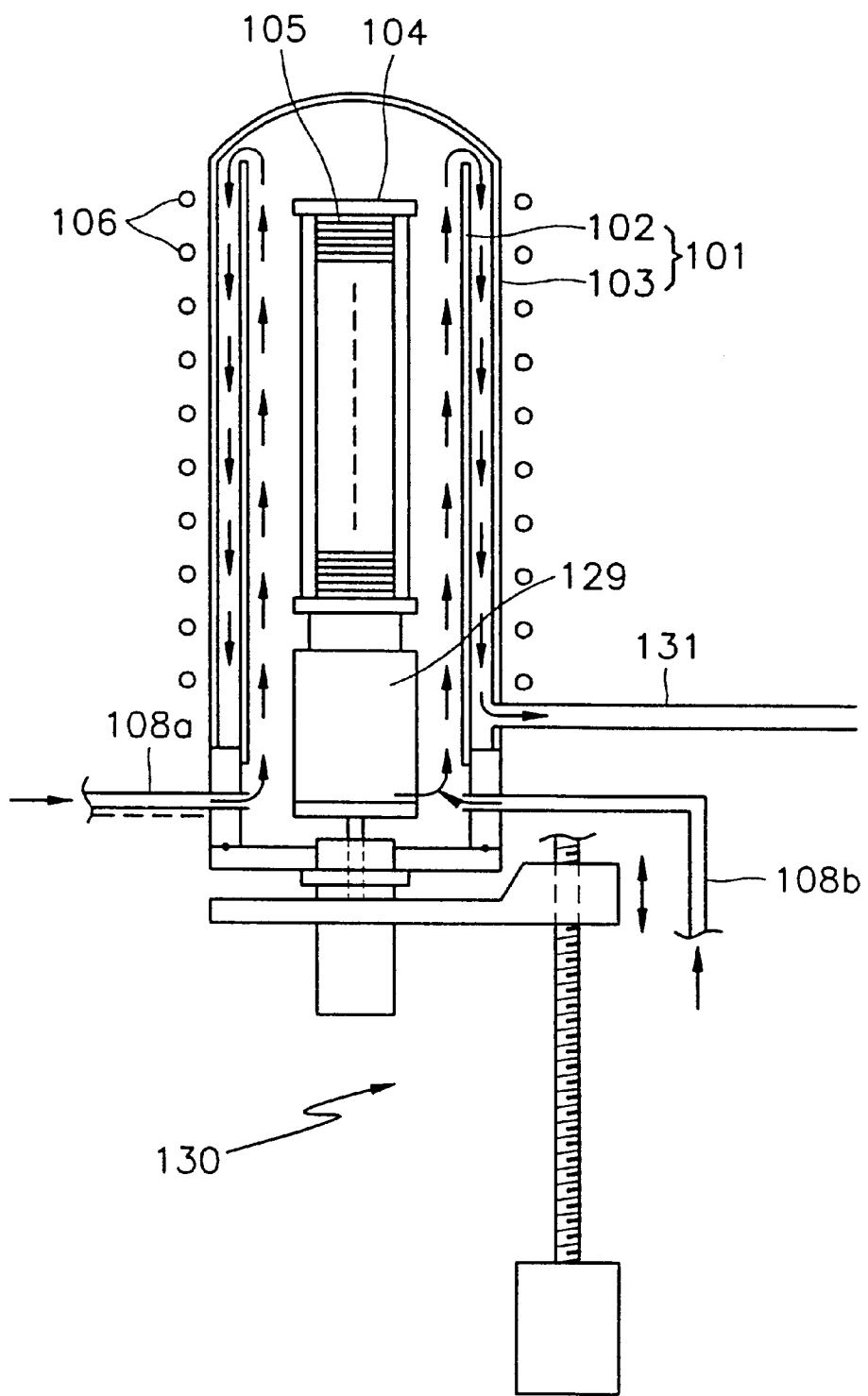
FIG. 1 is a sectional view of a vertical chemical vapor deposition (CVD) apparatus used for stripping a wafer according to the present invention.

The present invention now will be described more fully hereinafter with reference to the accompanying drawings. In the drawings, the thickness of layers and regions are exaggerated for clarity, and like reference numbers refer to like elements throughout. It will also be understood that when an element such as a layer, region or substrate is referred to as being "on" another element, it can be directly on the other element or intervening elements may also be present. On the other hand, when an element is referred to as being "directly on" another element, there are no intervening elements present.

Referring now to FIG. 1, a chemical vapor deposition (CVD) apparatus used for carrying out the wafer stripping method of the present invention includes a CVD chamber 101 and a boat 104. The boat 104 on which wafers 105 are mounted is loaded into the chamber 101 to grow a desired film on the wafers 105. The chamber 101 comprises an inner tubular member 102 and an outer tubular member 103. The boat 104 and the chamber 101 are formed of quartz. A heater 106 surrounds the chamber 101. The CVD apparatus also includes a plurality of gas inlet tubes 108a and 108b for injecting into the chamber 101 various gases depending on the types of films to be grown, and a gas outlet tube 131 for exhausting the gas from the chamber 101. The boat 104 is installed on an adiabatic sleeve 129 and is transported into or out of the chamber 101 by a boat drive unit 130.

Figure 2:
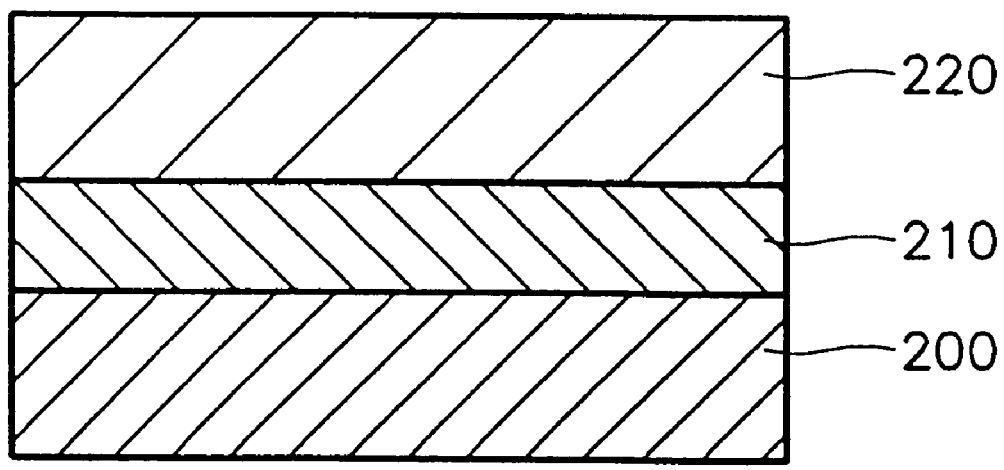
FIG. 2 is a sectional view of a test wafer in which a lower film and an upper film are sequentially formed on a substrate to evaluate the method of the present invention.

FIG. 2 shows a test wafer having a lower film 210 and an upper film 220 which were sequentially formed on the substrate 200 of the wafer. A method of stripping the upper film 220 from the wafer will now be described.

A plurality of the test wafers 200 are mounted on the boat 104. The boat 104 is loaded into the chamber 101, and then a gas is injected into the tube 101 through the gas inlet tube 108a to strip the upper film 220 from each of the test wafers 200.

The gas may be selected according to the type of upper film 220 to be stripped. When the upper film 220 is polysilicon, $ClF_3$ is used at a flow rate of 500~1,000 sccm, preferably, 700 sccm. For example, a polysilicon film having a thickness of 16,000 Å can be completely stripped from the wafer by injecting the $ClF_3$ into the chamber 101 at the above-mentioned flow rate for 85~100 min.

While the upper film 220 formed on the substrate 200 is being stripped, the temperature in the chamber 101 is preferably maintained at 350~450° C., and more preferably, at 400° C. Also, while the upper film 220 is being stripped, the pressure in the chamber 101 is preferably maintained at 1.0~2.0 Torr, and more preferably, at 1.5 Torr. To this end, ambient gas is injected through the gas inlet tube 108b to maintain the pressure in the chamber 101 constant. $N_2$ or Ar is preferably used as the ambient gas, and is preferably injected into the tube at a rate of 2,500~3,000 sccm, and more preferably, at 2,800 sccm.

Furthermore, as the stripping gas is being injected into the chamber 101, the boat 104 on which the wafers are mounted is rotated. This action assists in the removal of the upper film 220 from the wafers.

Figure 3:
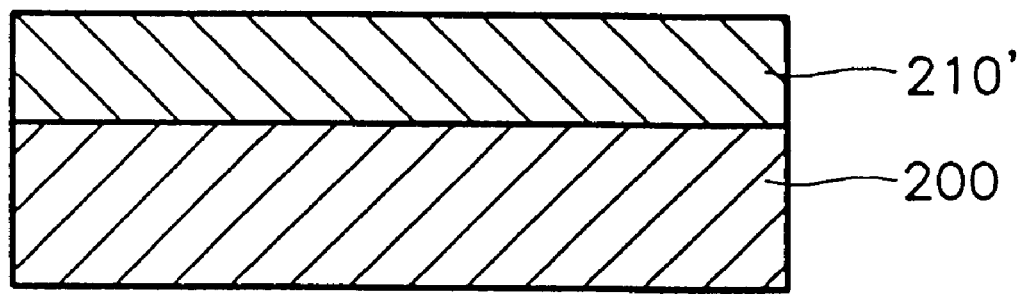
FIG. 3 is a sectional view showing the test wafer of FIG. 2 after the upper film has been stripped according to the method of the present invention.

After the upper film 220 has been stripped according to the present invention, only a lower film 210' remains on the substrate 200 of the test wafer, as shown in FIG. 3.

Characteristics of the Lower Film Confirmed by TXRF Analysis

The effect of the present invention on the lower film was checked as follows. With reference to FIG. 2, an oxide film 210 having a thickness of 5,000Å, and a polysilicon film 220 having a thickness of 16,000Å were formed on a substrate of the test wafer. Then, the test wafer was loaded into the CVD chamber 101 shown in FIG. 1, and $ClF_3$ was injected into the chamber 101 at a rate of 700 sccm for 90 min, to strip the upper film 220. Subsequently, a TXRF (total reflection X-ray fluorescence) analysis was performed on the test wafer for examining the amounts of elements existing on the lower film 210' after the upper film 220 was stripped therefrom. The result of the TXRF analysis is shown in Table 1 and in FIG. 4.

TXRF analysis is employed to analyze inorganic elements existing on the surface of a sample by detecting the fluorescence of a surface of a sample radiated with X-rays. However, it should be noted that only elements of atomic number 10 or higher can be detected using TXRF analysis.

Meanwhile, a comparison wafer was analyzed to allow the effects of the present invention on the lower film 210 to be fully evaluated. In the comparison wafer, a lower film (i.e., oxide film) was formed on a substrate under the same conditions and at the same thickness as the lower film 210 of the sample wafer, but no upper film was formed thereon. Then, the amounts of elements existing on the oxide film were determined by TXRF analysis. The results are also shown in Table 1 and in FIG. 4.

In Table 1, comparison 1 refers to the TXRF analysis of the oxide film of the comparison wafer, and samples 1 through 4 refer to the TXRF analysis of the oxide film of four test wafers after the upper film was stripped from the test wafers according to the present invention. Moreover, in Table 1, the units are $10^{10}$ atoms/cm$^2$, and each value listed is each actually the mean of four values obtained from points distributed evenly about the wafer.

TABLE 1

TXRF (Total Reflection X-ray Fluorescence) Analysis

| ELEMENT | COMPARISON 1 | SAMPLE 1 | SAMPLE 2 | SAMPLE 3 | SAMPLE 4 |
| --- | --- | --- | --- | --- | --- |
| S | 187 | 255 | 171 | 699 | 860 |
| Cl | 154 | 208 | 110 | 119 | 140 |
| K | 0.65 | 1.27 | 1.03 | 0.32 | 1.31 |
| Sn | 2.13 | 1.66 | 3.3 | 1.94 | 1.46 |
| Ca | 1.96 | 2 | 3.15 | 2.46 | 2.39 |
| I | 0.77 | 0.66 | 0.81 | 0.67 | 0.46 |
| Ti | 0.79 | 0.74 | 0.44 | 0.5 | 0.57 |
| Cr | 0.53 | 0.45 | 0.4 | 0.38 | 0.27 |
| Mn | 0.81 | 0.85 | 0.93 | 0.56 | 0.53 |
| Fe | 1.07 | 1.11 | 1.76 | 0.71 | 0.64 |
| Ni | 1.05 | 1.03 | 1.09 | 0.69 | 0.75 |
| Cu | 0.39 | 0.79 | 0.48 | 0.47 | 0.43 |
| Zn | 0.09 | 0.1 | 0.13 | 0.08 | 0.09 |

Figure 4:
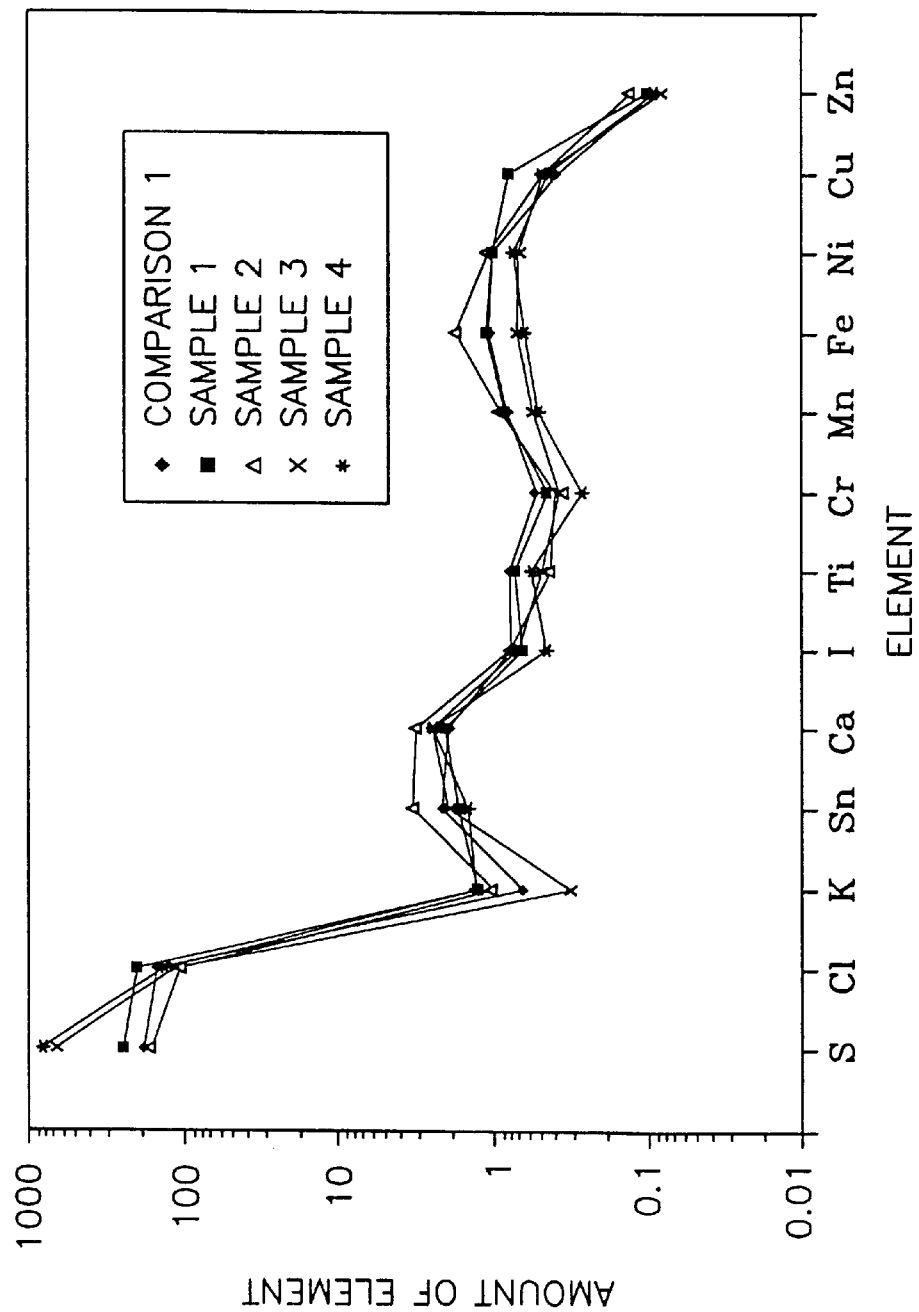
FIG. 4 is a graph of a TXRF analysis comparing the amounts of elements existing on the lower film of the wafer shown in FIG. 2, after the upper film has been stripped therefrom according to the method of the present invention, to the amounts of the same elements existing on the lower film of a comparison wafer in which no upper film was formed.

FIG. 4 is a log graph of the values listed in Table 1. That is, in FIG. 4, the elements are distributed along the X-axis, and the amounts of each element found in the lower film are distributed in a logarithm along the Y-axis.

Referring to Table 1 and FIG. 4, it is apparent that there is no difference in quality between the oxide film formed on the comparison wafer and the oxide film on the test wafer from which an upper film had stripped according to the present invention. Accordingly, it can be inferred that stripping the polysilicon film (i.e., the upper film) according to the present invention does not affect the oxide film (i.e., the lower film). In FIG. 4, there was a small difference in the amount of S (sulfur) between the comparison wafer and the sample wafers. However, considering that the units of measurement are $10^{10}$ atoms/cm$^2$, the difference is not considered to be appreciable.

Characteristics of the Lower Film Confirmed by HPIC Analysis

An HPIC (high performance ion chromatography) analysis was also performed for determining what effect, if any, the present invention has on the lower film 210. The sample wafers and a comparison wafer analyzed by the HPIC process were equivalent to those prepared for the TXRF analysis.

HPIC analysis is employed to analyze a sample by separating the components, or solutes, of a mixture on the basis of the relative amounts of each solute distributed between a moving fluid stream, called the mobile phase, and a contiguous stationary phase.

Table 2 shows the results of the HPIC analysis. In Table 2, comparison 1 refers to the HPIC analysis of the lower film 210 of the comparison wafer, and samples 1 through 4 refer to the HPIC analysis of the lower film 210' of samples from which the upper film 220 had been stripped according to the method of the present invention. In Table 2, the units are $10^{-13}$ atoms/cm$^2$.

TABLE 2

HPIC (High Performance Ion Chromatography) Analysis

| ELEMENT | COM-PARISON 1 | SAMPLE 1 | SAMPLE 2 | SAMPLE 3 | SAMPLE 4 |
|---|---|---|---|---|---|
| Li | 0.19 | 0.19 | 0.19 | 0.19 | 0.19 |
| Na | 0.09 | 0.22 | 0.06 | 0.07 | 0.24 |
| NH$_4$ | 4.16 | 5.10 | 3.53 | 5.67 | 5.86 |
| K | 0.05 | 0.13 | 0.09 | 0.32 | 0.36 |
| F | 3.19 | 5.16 | 16.73 | 1.50 | 2.87 |
| Cl | 0.08 | 0.09 | 0.07 | 0.12 | 0.09 |
| NO$_2$ | 0.08 | 0.06 | 0.09 | 0.13 | 0.11 |
| Br | 0.02 | 0.02 | 0.02 | 0.02 | 0.02 |
| NO$_3$ | 0.03 | 0.09 | 0.11 | 0.08 | 0.06 |
| HPO$_4$ | 0.01 | 0.01 | 0.01 | 0.22 | 0.18 |
| SO$_4$ | 0.08 | 0.09 | 0.01 | 0.84 | 0.98 |

Figure 5:
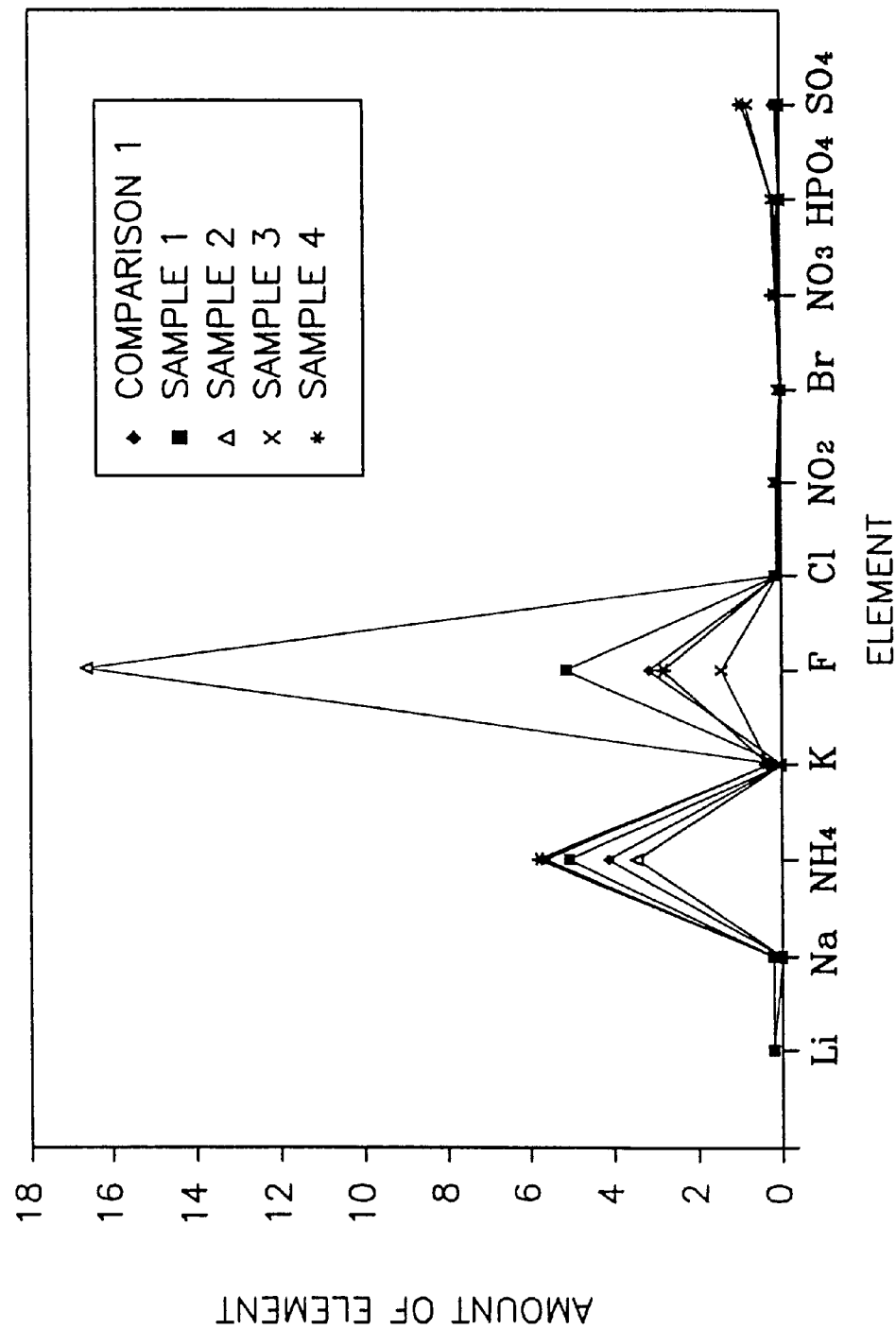
FIG. 5 is a graph of an HPIC analysis comparing the amounts of elements existing on the lower film of the wafer shown in FIG. 2, after the upper film has been stripped therefrom according to the method of the present invention, to the amounts of the same elements existing on the lower film of a comparison wafer in which no upper film was formed.

FIG. 5 is a graph of the values listed in Table 2. In FIG. 5, the elements are distributed along the X-axis, and the amounts of the elements existing on the lower film are distributed along the Y-axis in units of 10–13 atoms/cm$^2$. Table 2 and FIG. 5 show that there is little difference in the qualities of the oxide films of the comparison wafer and the sample wafers. Although FIG. 5 shows some difference in the case of fluorine (F), this difference is negligible considering that the units are on the order of $10^{-13}$ atoms/cm$^2$. Accordingly, it is clear that stripping the polysilicon film (i.e., the upper film) according to the present invention does not affect the oxide film (i.e., the lower film).

Because the upper film can be stripped according to the present invention without affecting the lower film, there is no need to reform the lower film when reusing the wafer as a test wafer. Therefore, the present invention saves time and costs. Also, because the present invention makes use of a CVD apparatus, a plurality of wafers can be simultaneously stripped, whereby the present invention is efficient.

Although the present invention has been described through the use of preferred embodiments thereof, it should be clear that various changes and modifications can be made thereto without departing from the true spirit of the present invention. For example, the lower film need not be an oxide layer but can be other layers, such as a nitride layer. Accordingly, all such changes and modifications are seen to be within the scope of the present invention as defined by the appended claims.

What is claimed is:

1. A method of stripping a film from a wafer, said method comprising the steps of:
    loading a wafer having a substrate and a film disposed on the substrate into a chamber of a chemical vapor deposition apparatus; and
    injecting gas into the chamber of the chemical vapor deposition apparatus to thereby strip the wafer of said film.

2. The method of claim 1, wherein said step of loading comprises loading a wafer having a substrate and a polysilicon film disposed on the substrate into a chemical vapor deposition apparatus.

3. The method of claim 2, wherein said step of injecting comprises injecting CIF$_3$ into the chamber of the chemical vapor deposition apparatus.

4. The method of claim 3, wherein said step of injecting comprises injecting the CIF$_3$ into the chamber at a rate of 500~1,000 sccm.

5. The method of claim 2, and further comprising a step of maintaining the temperature inside the chamber of the chemical vapor deposition apparatus to within 350~450° C.

6. The method of claim 2, and further comprising a step of maintaining the pressure inside the chamber of the chemical vapor deposition apparatus constant and within a range of 1.0~2.0 Torr.

7. The method of claim 6, wherein the step of maintaining the pressure inside the chamber of the chemical vapor deposition apparatus comprises injecting ambient gas into the chamber discrete from the gas used to strip the wafer.

8. The method of claim 7, wherein the ambient gas is selected from the group consisting of N$_2$ and Ar.

9. The method of claim 7, wherein said step of maintaining the pressure inside the chamber comprises injecting the ambient gas into the chamber at a rate of 2,500~3,000 sccm.

10. The method of claim 1, and further comprising a step of injecting ambient gas into the chamber discrete from the gas used to strip the wafer, to maintain the pressure within the chamber constant.

11. The method of claim 10, wherein the ambient gas is selected from the group consisting of N$_2$ and Ar.

12. The method of claim 10, wherein said step of injecting comprises injecting the ambient gas into the chamber at a rate of 2,500~3,000 sccm.

13. The method of claim 10, wherein the ambient gas is injected at a rate that maintains the pressure inside the chamber of the chemical vapor deposition apparatus constant and within a range of 1.0~2.0 Torr.

14. The method of claim 1, and further comprising a step of rotating the wafer as the gas is injected into the chamber of the chemical vapor deposition apparatus.

15. A method of testing the quality of films of semiconductor wafers, said method comprising the steps of:
    loading a semiconductor wafer substrate and a test wafer substrate into a chamber of a chemical vapor deposition apparatus and simultaneously depositing a film on the substrates by chemical vapor deposition, to thereby prepare a semiconductor wafer product and a test wafer;
    subsequently removing the semiconductor wafer product and the test wafer from the chamber of the chemical vapor deposition apparatus and performing a quality test on the film formed on the test wafer substrate to evaluate the quality of the film of the semiconductor wafer product; and
    reusing the test wafer by thereafter loading the test wafer substrate having the film formed thereon back into a processing chamber,
    subsequently injecting gas into the processing chamber to thereby strip the film from the test wafer substrate, and
    subsequently loading a new semiconductor wafer substrate into the chamber of the chemical vapor deposition apparatus, and depositing a film simultaneously on the test wafer substrate and on the new semiconductor wafer substrate by chemical vapor deposition.

16. The method of claim 15, and further comprising a step of injecting ambient gas, discrete from the gas used to strip the test wafer, into the processing chamber, after the test wafer has been loaded into the processing chamber, to maintain the pressure within the processing chamber constant as the test wafer is being stripped.

17. The method of claim 16, wherein the ambient gas is selected from the group consisting of N$_2$ and Ar.

18. The method of claim 15, and further comprising a step of rotating the test wafer as the gas is being injected into the processing chamber to strip the test wafer.

* * * * *